United States Patent
Inaba et al.

(10) Patent No.: US 7,623,166 B2
(45) Date of Patent: Nov. 24, 2009

(54) SOLID-STATE IMAGING DEVICE WITH HIGH PIXEL COUNT THAT INCLUDES COLOR FILTER WITH HIGH COLOR REPRODUCIBILITY AND CAMERA THAT USES IT

(75) Inventors: Yuichi Inaba, Osaka-fu (JP); Masahiro Kasano, Osaka-fu (JP)

(73) Assignee: Panasonic Corporation, Osaka (JP)

( * ) Notice: Subject to any disclaimer, the term of this patent is extended or adjusted under 35 U.S.C. 154(b) by 557 days.

(21) Appl. No.: 11/452,952

(22) Filed: Jun. 15, 2006

(65) Prior Publication Data
US 2006/0285005 A1 Dec. 21, 2006

(30) Foreign Application Priority Data
Jun. 15, 2005 (JP) ............................. 2005-175435

(51) Int. Cl.
*H04N 3/14* (2006.01)
*H04N 5/335* (2006.01)
*H04N 9/04* (2006.01)
*H04N 9/083* (2006.01)

(52) U.S. Cl. ...................... 348/273; 250/208.1; 257/431

(58) Field of Classification Search ......... 348/273–277, 348/280; 250/208.1, 214.1, 226; 257/431–437
See application file for complete search history.

(56) References Cited

U.S. PATENT DOCUMENTS 7,416,915 B2 * 8/2008 Kasano et al. ............... 438/70
2005/0174664 A1 * 8/2005 Ito et al. ..................... 359/883
2006/0205107 A1 * 9/2006 Inaba et al. .................. 438/57

OTHER PUBLICATIONS

Takao Ando, et al., "The Workings of an Electronic Eye," Introduction to Solid-State Imaging Devices, Dec. 1999, pp. 183-188, Ed. Institute of Image Information and Television Engineers, Nihon Riko Shuppankai.

* cited by examiner

*Primary Examiner*—Lin Ye
*Assistant Examiner*—Gevell Selby
(74) *Attorney, Agent, or Firm*—McDermott Will & Emery LLP

(57) ABSTRACT

A solid-state imaging device is composed of a P-type semiconductor layer, an interlayer insulation film, a multilayer interference filter and condenser lenses which have been successively laminated on an N-type semiconductor layer. A photodiode, in which N-type impurities have been ion-implanted, is formed per pixel in the P-type semiconductor layer on the interlayer insulation film side. The multilayer interference filter has a composition including $\lambda/4$ multilayer films and a plurality of spacer layers sandwiched therebetween. The $\lambda/4$ multilayer films are composed of alternately laminated monotitanium dioxide layers and monosilicon dioxide layers that have the same optical thickness. The spacer layers have optical thicknesses corresponding to colors of light they are to transmit. A spacer layer is not included in a green region. Instead, two monotitanium dioxide layers, each of which constitutes a $\lambda/4$ multilayer film, are adjoined to make a monotitanium dioxide layer with an optical thickness of $\lambda/2$.

6 Claims, 8 Drawing Sheets

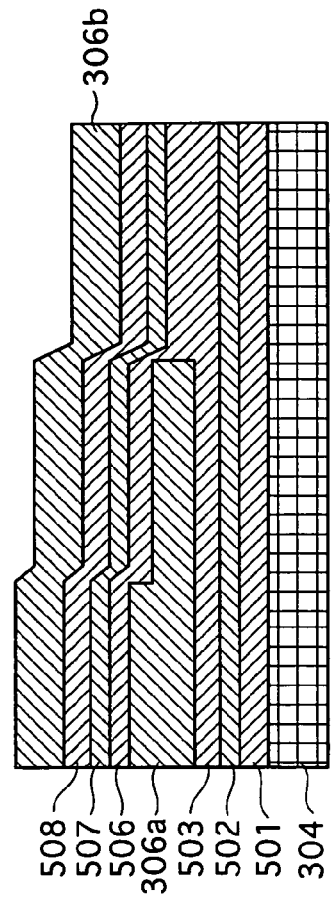
FIG.6A
FIG.6B
FIG.6C
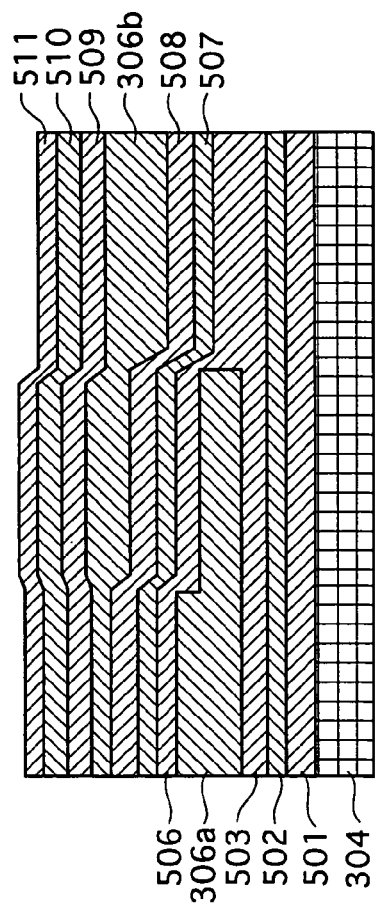
FIG.6D
FIG.6E

SOLID-STATE IMAGING DEVICE WITH HIGH PIXEL COUNT THAT INCLUDES COLOR FILTER WITH HIGH COLOR REPRODUCIBILITY AND CAMERA THAT USES IT

This application is based on an application no. 2005-175435 filed in Japan, the content of which is hereby incorporated by reference.

BACKGROUND OF INVENTION

1. Field of the Invention

The present invention relates to a solid-state imaging device and a camera, and in particular to technology for expanding the bandwidth of light transmitted by a color filter provided in the solid-state imaging device.

2. Related Art

In recent years, the range of applications for solid-state imaging devices has been expanding explosively, and includes digital cameras and mobile phones. Colorization is essential in any of the fields of application.

FIG. 1 is a cross-sectional view of pixel portions of a solid-state imaging device pertaining to conventional technology. As shown in FIG. 1, the pixel portions of a solid-state imaging device 8 have a constitution in which a P-type semiconductor layer 802, an interlayer insulation film 804, organic pigment color filters 806 and condenser lenses 807 are laminated successively on an N-type semiconductor layer 801. Note that photodiodes 803 are formed in the P-type semiconductor layer 802 on the interlayer insulation film 804 side, and a light shielding film 805 is formed in the interlayer insulation film 804.

Light which incidents on the solid-state imaging device 8 is condensed by the condenser lenses 807 and separated into specified colors by the color filters 806 before incidenting on corresponding photodiodes (e.g., see "Introduction to Solid-State Imaging Devices", Ando and Komobuchi, Ed. Institute of Image Information and Television Engineers, Nihon Riko Shuppankai, December, 1999, pp. 183-188).

Due, however, to the fact that improvements in picture quality are constantly sought for solid-state imaging devices, pixel-count as well as color reproducibility must be increased. In response to this demand, solid-state imaging devices pertaining to conventional technology use organic pigment color filters, but color reproducibility declines since the color selectivity of the color filters is reduced as the pixels are made smaller. In other words, conventional structures cannot achieve both a high pixel count and color reproducibility.

SUMMARY OF INVENTION

In view of the above issue, a first object of the present invention is to provide a solid-state imaging device with a high pixel count and that includes a color filter with high color reproducibility.

In order to achieve to the above object, the solid-state imaging device pertaining to the present invention includes a multilayer interference filter that transmits incident light of a predetermined wavelength, the multilayer interference filter including N λ/4 multilayer films, each λ/4 multilayer film being constituted from two types of dielectric layers that are alternately laminated, have a same optical thickness, and have a different refractive index; and M insulation layers, being alternately laminated with the N λ/4 multilayer films, and each of the M insulation layers having an optical thickness different from the optical thickness of each of the dielectric layers that constitute the N λ/4 multilayer films, wherein N is a value greater than or equal to 3, and M is a value greater than 1 and less than N.

According to this structure, the use of a multilayer interference filter enables the miniaturization of color filters and an increase in pixel-count. Also, providing a plurality of insulation layers (spacer layers) in the multilayer interference filter enables an improvement in color reproduction by expanding the passband width with respect to each color of light.

In this case, N may have a lowest value among possible values of N. According to this structure, it is possible to further miniaturize the color filters and improve color reproduction.

Also, the solid-state imaging device pertaining to the present invention may further include a plurality of two-dimensionally arranged pixels, each of the plurality of pixels detecting one of three primary colors, wherein the multilayer interference filter may be included in, from among the plurality of pixels, a pixel that detects blue light. Whereas the passband width with respect to blue light in particular tends to be narrow in the multilayer interference filter, providing a plurality of spacer layers in this way enables the expansion of the passband width with respect to blue light. It is therefore possible to eliminate variations in the amount of light for each color to improve color reproduction. In this case, there may be only a single spacer layer in the multilayer interference filter with respect to other colors.

Also, the solid-state imaging device pertaining to the present invention may further include a plurality of two-dimensionally arranged pixels, wherein the multilayer interference filter may be included in each of the pixels, in each of the pixels, the multilayer interference filter included therein may selectively transmit a color of light to be detected by the pixel, and a film thickness of the multilayer interference filter may be substantially the same regardless of the color of light to be transmitted. According to this structure, it is possible to easily form condenser lenses or the like on the multilayer interference filter.

Also, in the solid-state imaging device pertaining to the present invention, the M insulation layers may be composed of a material used in the N λ/4 multilayer films. According to this structure, it is possible to reduce the cost of manufacturing the multilayer interference filter.

A camera pertaining to the present invention includes a solid-state imaging device that includes a multilayer interference filter which transmits incident light of a predetermined wavelength, the multilayer interference filter includes N λ/4 multilayer films, each λ/4 multilayer film being constituted from two types of dielectric layers that are alternately laminated, have a same optical thickness, and have a different refractive index; and M insulation layers, being alternately laminated with the N λ/4 multilayer films, and each of the M insulation layers having an optical thickness different from the optical thickness of each of the dielectric layers that constitute the N λ/4 multilayer films, wherein M is a value less than N. According to this structure, the camera can be miniaturized, thereby enabling the camera to be applied in a mobile phone and other devices in which size is a problem when including a camera. It is also possible to take images that have even better color reproduction.

BRIEF DESCRIPTION OF DRAWINGS

These and other objects, advantages, and features of the invention will become apparent from the following description thereof taken in conjunction with the accompanying drawings, which illustrate a specific embodiment of the present invention.

In the Drawings:

FIG. 5A shows spectral properties of a multilayer interference filter 306 included in the solid-state imaging device 102 pertaining to the embodiment of the present invention, and FIG. 5B shows spectral properties of a multilayer interference filter in which there is a single spacer layer;

FIGS. 6A to 6E show manufacturing processes of the multilayer interference filter 306 pertaining to the embodiment of the present invention;

DETAILED DESCRIPTION OF PREFERRED EMBODIMENTS

An embodiment of the present invention is described below, taking a digital still camera as an example, and with reference to the drawings.

1. Structure of the Digital Still Camera

First is a description of the structure of the digital still camera pertaining to the embodiment of the present invention.

Figure 1:
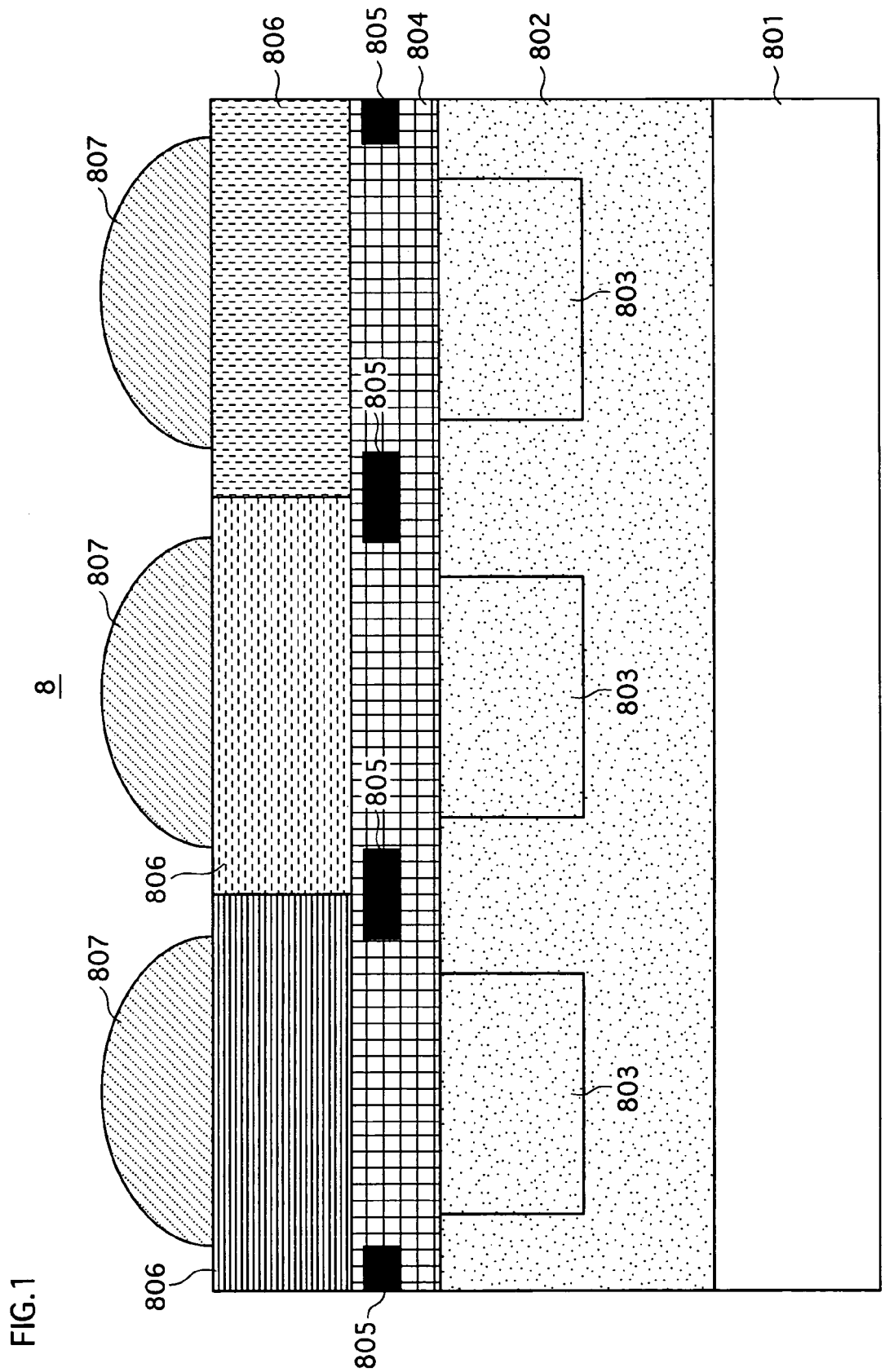
FIG. 1 is a cross-sectional view of pixel portions of a solid-state imaging device pertaining to conventional technology.
Figure 2:
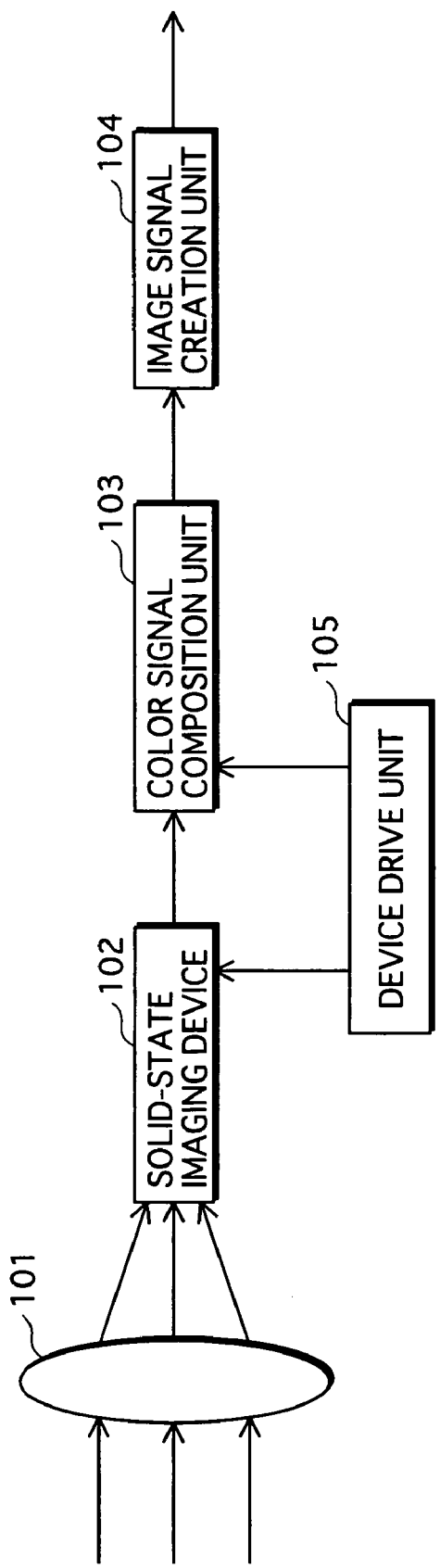
FIG. 2 is a block diagram showing a principal functional structure of a digital still camera pertaining to an embodiment of the present invention.

FIG. 2 is a block diagram showing a principal functional structure of the digital still camera pertaining to the present embodiment.

As shown in FIG. 2, a digital still camera 1 pertaining to the present embodiment includes a lens 101, a solid-state imaging device 102, a color signal composition unit 103, an image signal creation unit 104 and a device drive unit 105.

The lens 101 focuses incident light on an imaging region of the solid-state imaging device 102. The solid-state imaging device 102 photoelectric-converts the incident light to generate color signals. The device drive unit 105 extracts the color signals from the solid-state imaging device 102. The color signal composition unit 103 performs color shading on the color signals received from the solid-state imaging device 102. The image signal creation unit 104 generates color image signals from the color signals which were color shaded by the color signal composition unit 103. The color image signals are ultimately recorded to a recording medium as color picture data.

2. Structure of the Solid-State Imaging Device

Next is a description of the structure of the solid-state imaging device 102.

Figure 3:
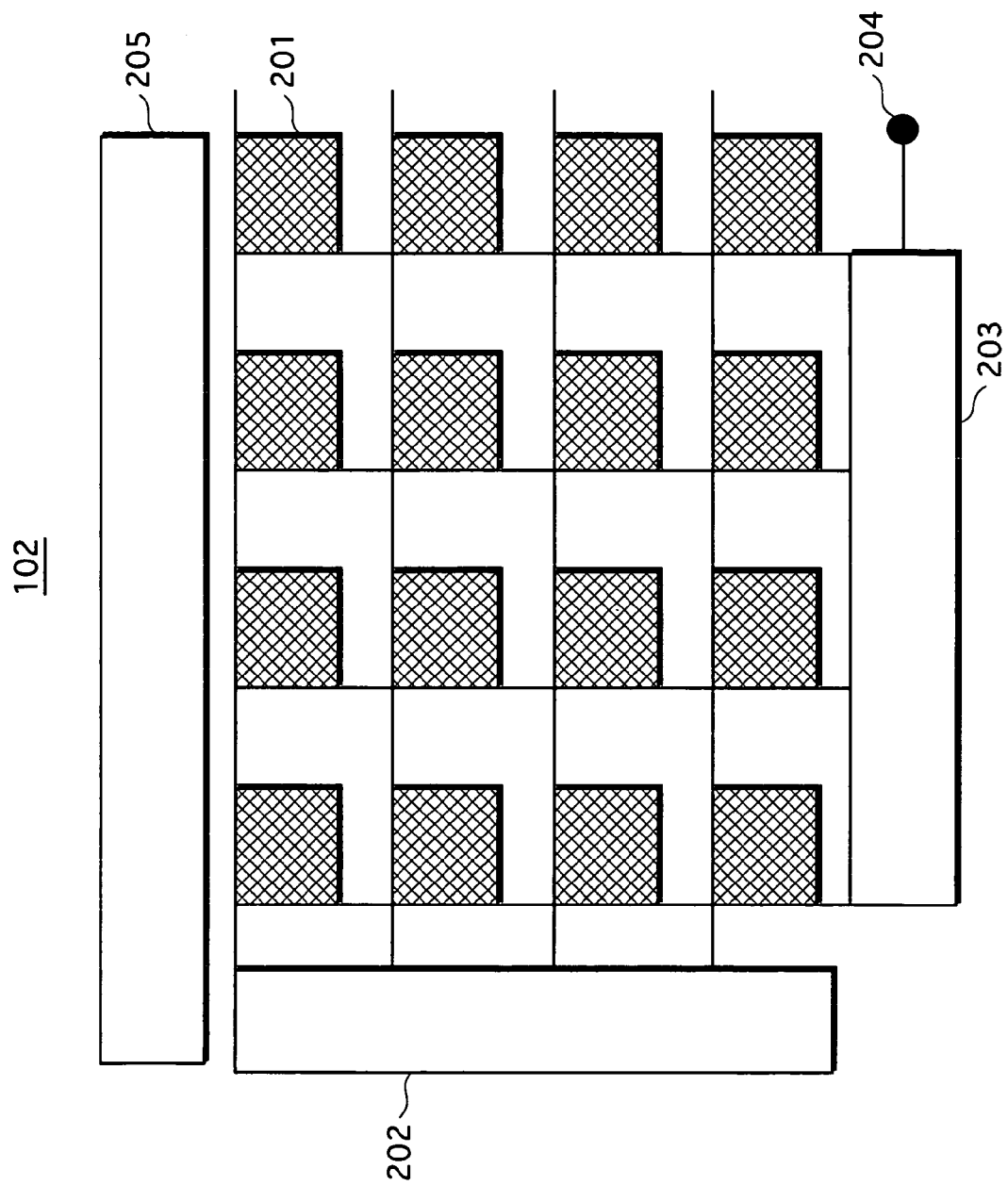
FIG. 3 shows an overview of a structure of a solid-state imaging device 102 included in the digital still camera pertaining to the embodiment of the present invention.

FIG. 3 shows a schematic structure of the solid-state imaging device 102. As shown in FIG. 3, a color signal for each pixel is output from an output amplifier 204 in the solid-state imaging device 102 as a result of a vertical shift register 202 selecting a row of two-dimensionally arranged unit pixels 201, and a horizontal shift register 203 selecting a signal from the selected row. Note that the solid-state imaging device 102 uses a drive circuit 205 to drive the vertical shift register 202, the horizontal shift register 203 and the output amplifier 204.

Figure 4:
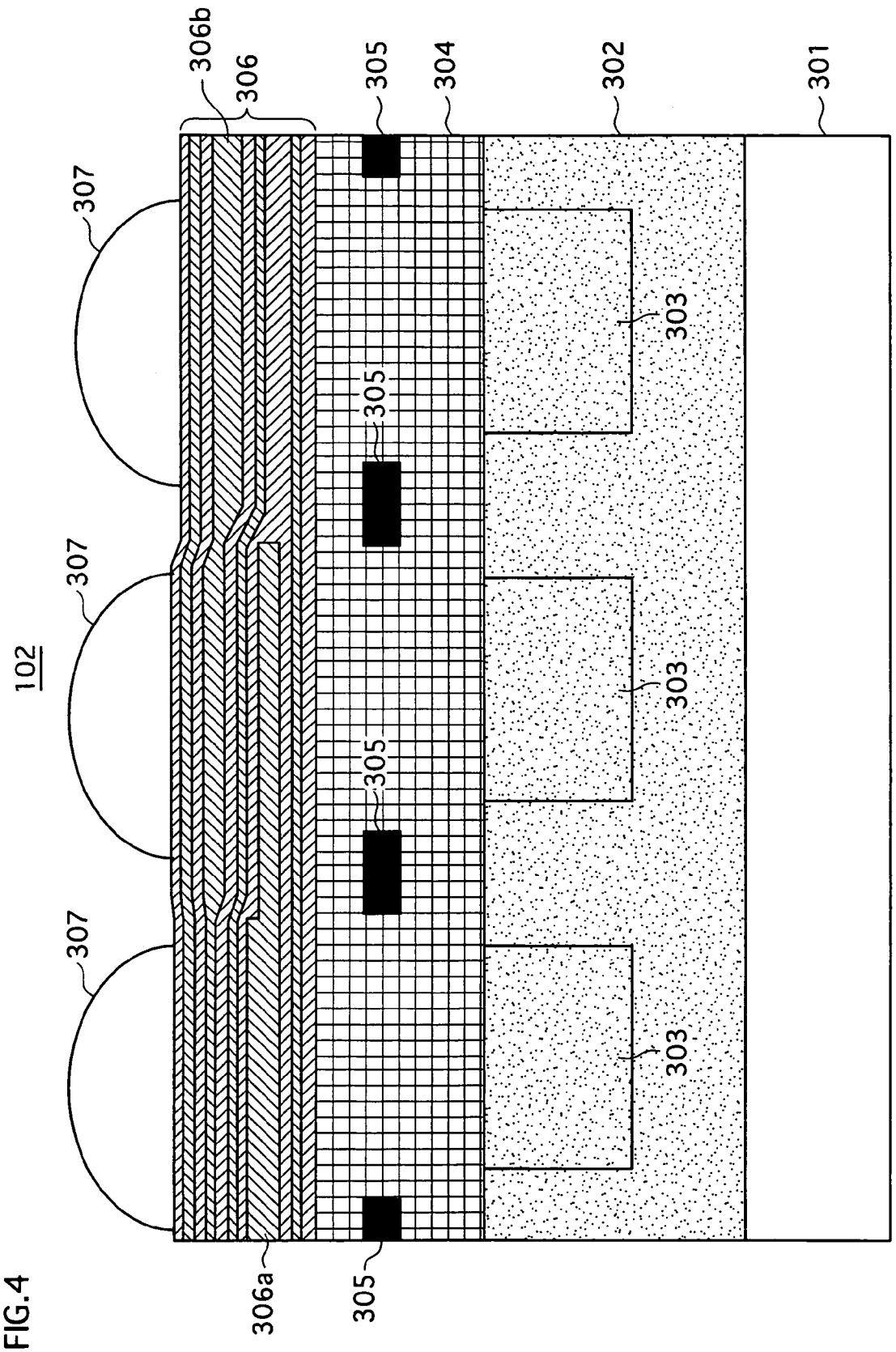
FIG. 4 is a cross-sectional view showing pixel portions of the solid-state imaging device 102 pertaining to the embodiment of the present invention.

FIG. 4 is a cross-sectional view showing pixel portions of the solid-state imaging device 102 pertaining to the present embodiment. As shown in FIG. 4, the solid-state imaging device 102 has a constitution in which a P-type semiconductor layer 302, an interlayer insulation film 304, a multilayer interference filter 306 and condenser lenses 307 are laminated successively on an N-type semiconductor layer 301. Note that a photodiode 303, in which N-type impurities have been ion-implanted, is formed per pixel in the P-type semiconductor layer 302 on the interlayer insulation film 304 side. The P-type semiconductor layer 302 separates adjacent photodiodes 303, and these regions are called device separation regions.

Also, a light shielding film 305 is formed in the interlayer insulation film 304. Each of the photodiodes 303 corresponds to a respective one of the condenser lenses 307, and the light shielding film 305 prevents light transmitted by a condenser lens 307 from incidenting on a non-corresponding photodiode 303.

The multilayer interference filter 306 has a structure which includes $\lambda/4$ multilayer films and spacer layers 306a and 306b sandwiched therebetween, and is composed of 11 dielectric layers. Each of the $\lambda/4$ multilayer films is composed of two types of dielectric layers which are alternately laminated and have an optical thickness substantially equal to ¼ of a predetermined wavelength $\lambda$, but have different refractive indexes. Of the two types of dielectric layers, the high refractive index layer is composed of monotitanium dioxide ($TiO_2$), and the low refractive index layer is composed of monosilicon dioxide ($SiO_2$). Here, optical thickness means an index obtained by multiplying the physical film thickness by the refractive index.

Since each of the spacer layers has an optical thickness corresponding to a color of light to be transmitted, the overall physical film thickness of the multilayer interference filter 306 differs per color of light to be transmitted. A red region, a green region and a blue region have physical film thicknesses of 691 nm, 682 nm and 874 nm respectively.

Note that the spacer layer 306a is not included in the green region. Instead, two monotitanium dioxide layers, each of which constitutes a $\lambda/4$ multilayer film, are adjoined to make a monotitanium dioxide layer with an optical thickness of $\lambda/2$. In other words, whereas both of the spacer layers in the red region and the blue region are composed of monosilicon dioxide, one of the spacer layers in the green region is composed of monotitanium dioxide.

The film thickness of the spacer layer 306a in the red region and the blue region is 30 nm and 120 nm respectively. Also, the film thickness of the spacer layer 306b in the red region, the green region and the blue region is 30 nm, 182 nm and 120 nm respectively.

3. Spectral Properties of the Multilayer Interference Filter 306

Next is a description of evaluation results with respect to the spectral properties of the multilayer interference filter 306 pertaining to the present embodiment. The evaluation results were calculated using a matrix method.

Figure 5B:
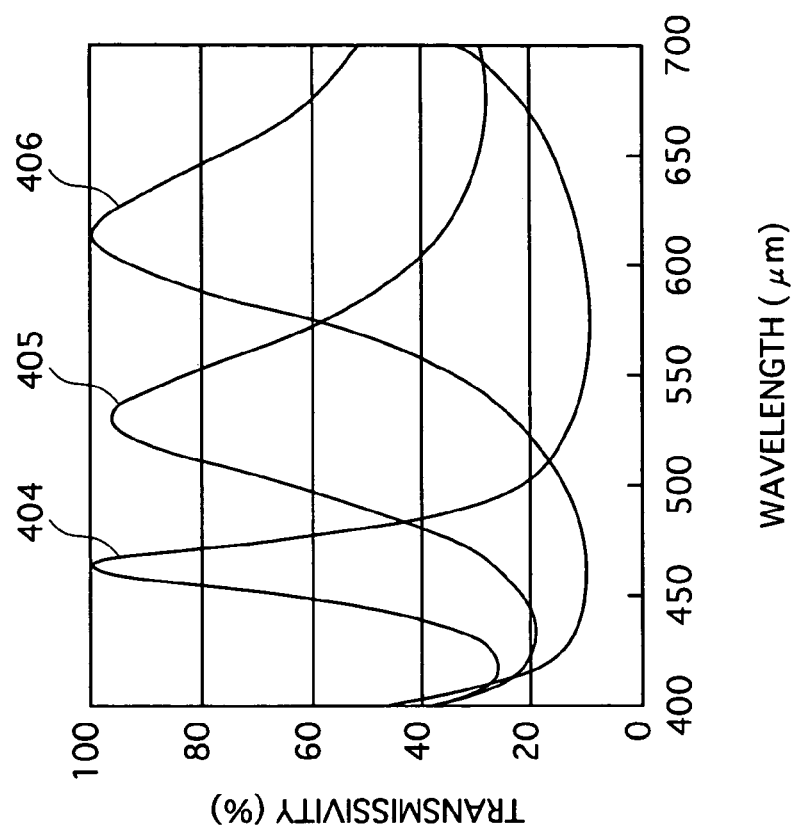
FIGS. 5A and 5B are graphs showing spectral properties of multilayer interference filters, whereby
Figure 5A:
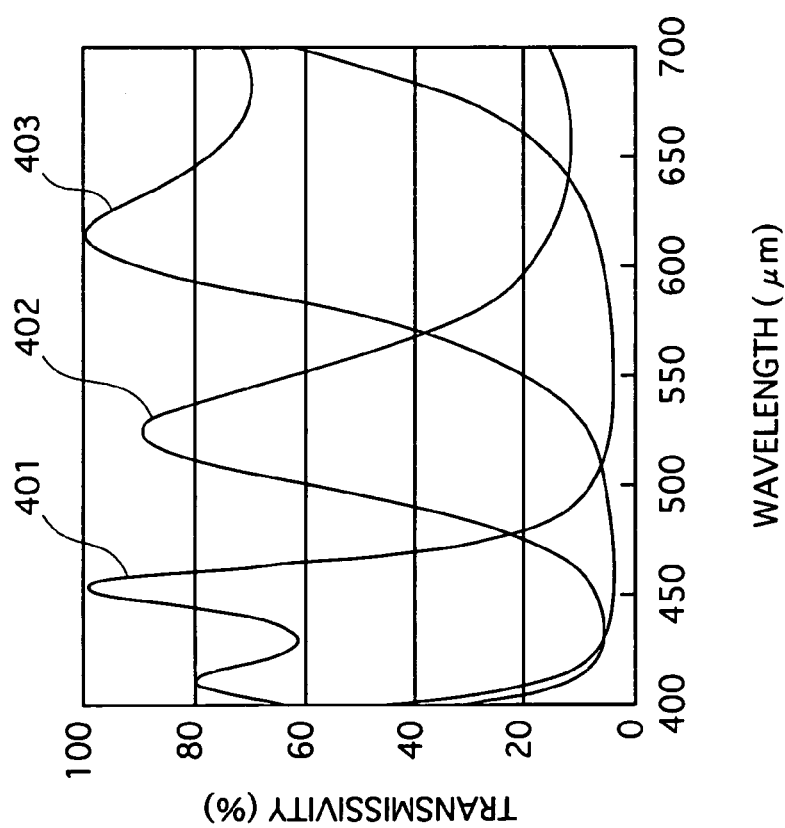

FIGS. 5A and 5B are graphs showing the spectral properties of multilayer interference filters. FIG. 5A shows the spectral properties of the multilayer interference filter 306, and FIG. 5B shows the spectral properties of a multilayer interference filter in which the spacer layer is a single layer. In both of the graphs, the vertical axis indicates transmissivity, and the horizontal axis indicates the wavelength of transmitted light.

In FIG. 5A, graphs 401, 402 and 403 show the spectral properties of the blue region, the green region and the red region respectively. In FIG. 5B, graphs 404, 405 and 406 show the spectral properties of the blue region, the green region and the red region respectively.

Figure 8:
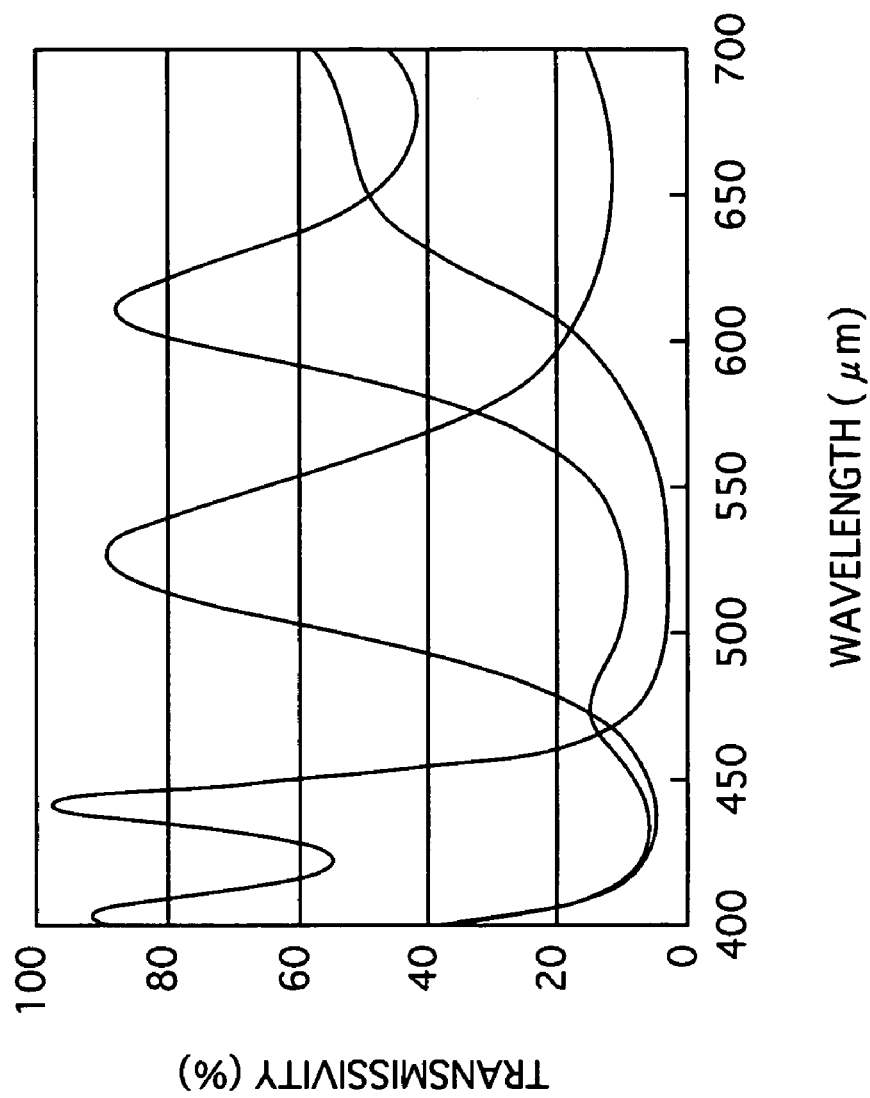
FIG. 8 is a graph showing spectral properties of a multilayer interference filter 6.

Note that when calculating the spectral properties, the multilayer interference filter is composed of 11 layers in FIG. 5A and 8 layers in FIG. 5B. Also, the central wavelength setting is 530 nm.

As shown in FIG. 5B, the passband width of the blue region is narrow compared to the passband widths of the green region and the red region when the spacer layer is a single layer. In contrast, the passband width of the blue region can be expanded as shown in FIG. 5A, if the spacer layer is composed of two layers.

Also, the transmissivity with respect to light outside the desired wavelength region can be reduced if the multilayer interference filter 306 is used. For example, in the blue region (graph 401) the transmissivity with respect to light with a 500 nm wavelength or more is reduced compared to graph 404.

The digital camera 1 can therefore take digital images that faithfully reproduce colors since the multilayer interference filter 306 has excellent color separation properties.

4. Manufacturing Method of the Multilayer Interference Filter 306.

Next is a description of the manufacturing method of the multilayer interference filter 306. FIGS. 6A to 6E show processes for manufacturing the multilayer interference filter 306. In these figures, the manufacturing processes for the multilayer interference filter 306 proceed from FIG. 6A to FIG. 6E. Also, depictions of the N-type semiconductor layer 301, the P-type semiconductor layer 302, the photodiodes 303 and the light shielding film 305 have been omitted.

First, an RF (radio frequency) sputtering device is used to successively laminate a monotitanium dioxide layer 501, a monosilicon dioxide layer 502 and a monotitanium dioxide layer 503 on the interlayer insulation film 304 to form a λ/4 multilayer film, and the spacer layer 306a is formed on the monotitanium dioxide layer 503 (FIG. 6A).

Next, the spacer layer 306a is etched such that the film thickness thereof is in correspondence with a wavelength region of light to be transmitted. In other words, a resist 504 is formed on the spacer layer 306a, and the red region of the spacer layer 306a is etched to set the film thickness (FIG. 6B).

Then, a resist 505 is formed on the spacer layer 306a, and the green region of the spacer layer 306a is etched and removed (FIG. 6C).

The resists 504 and 505 may be formed by, for example, applying a resist agent on a wafer surface, performing pre-exposure baking (prebake), then exposing the resist using a photolithography device such as a stepper, developing the resist, and performing final baking (postbake). The spacer layer 306 can also be etched using a tetrafluoromethane ($CF_4$) etching gas.

Next, a monotitanium dioxide layer 506, a monosilicon dioxide layer 507 and a monotitanium dioxide layer 508 are laminated successively on the spacer layer 306a and on the monotitanium dioxide layer 503 corresponding to the green region to form a λ/4 multilayer film, and the spacer layer 306b is formed on the monotitanium dioxide layer 508 (FIG. 6D).

After setting the film thicknesses of the green region and the blue region of the spacer layer 306b by etching, a monotitanium dioxide layer 509, a monosilicon dioxide layer 510 and a monotitanium dioxide layer 511 are laminated successively on the spacer layer 306b to form a λ/4 multilayer film, thereby completing the multilayer interference film 306.

5. Variations

Although having been described above based on the embodiment, the present invention is of course not limited to the above-mentioned embodiment. The following variations may also be implemented.

(1) Although the case of using monotitanium dioxide as the layer material with a high refractive index is described in the above embodiment, the present invention is of course not limited to this. The following may be implemented instead.

Another material such as silicon nitride ($Si_3N_4$), tantalum oxide ($Ta_2O_3$), or zirconium dioxide ($ZrO_2$) may be used as the layer material with a high refractive index, instead of using monotitanium dioxide. Also, a material other than monosilicon dioxide may be used as the layer material with a low refractive index. Effects of the present invention can be obtained with any combination of materials that have different refractive indexes.

(2) Although the case of the film thickness of the multilayer interference filter differing for each color of light to be transmitted is described in the above embodiment, the present invention is of course not limited to this. The following may be implemented instead.

Figure 7:
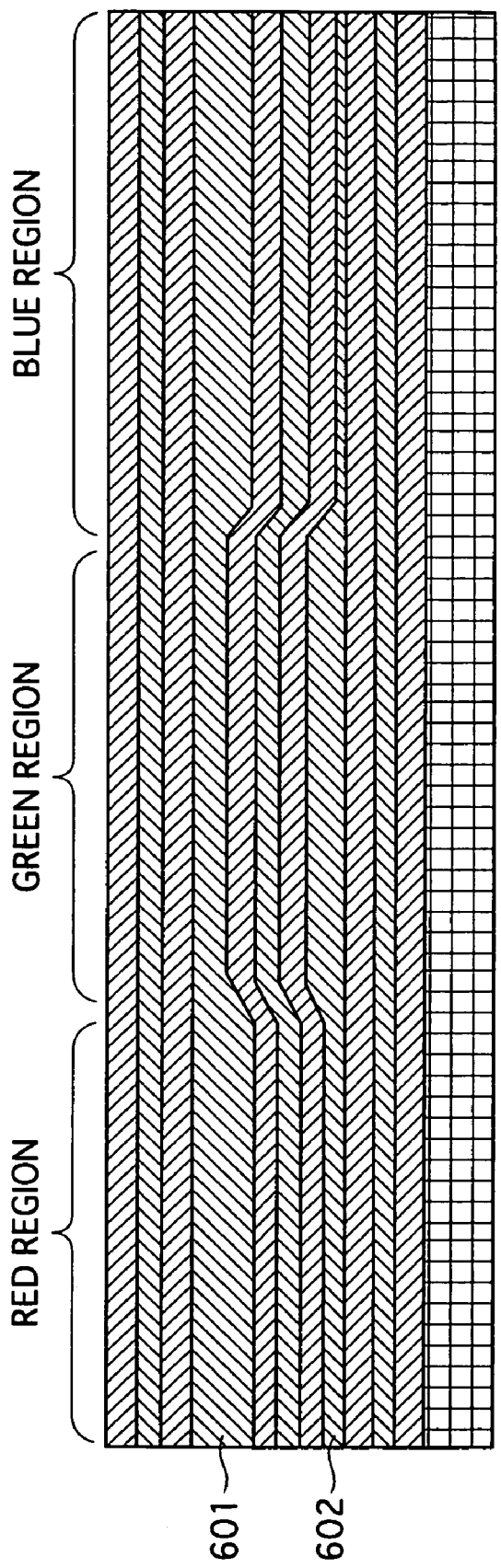
FIG. 7 is a cross-sectional view showing a structure of a multilayer interference filter pertaining to variation 2 of the present invention.

FIG. 7 is a cross-sectional view showing a structure of a multilayer interference filter pertaining to the present variation. As shown in FIG. 7, the film thickness of a multilayer interference filter 6 is constant, regardless of the color of light to be transmitted. The film thickness of a spacer layer 601 is 324 nm in the red region, 182 nm in the green region, and 252 nm in the blue region. The film thickness of a spacer layer 602 is 40 nm in the red region, 182 nm in the green region, and 112 nm in the blue region.

Consequently, the total film thickness of the spacer layers 601 and 602 is 364 nm in all of the regions, and the film thickness of the multilayer interference filter 6 is constant. As a result of this structure, condenser lenses and the like can be easily formed on the multilayer interference filter.

FIG. 8 is a graph showing spectral properties of the multilayer interference filter 6. It is apparent that the passband width has been expanded, the same as with the multilayer interference filter 306 pertaining to the above embodiment, and that the multilayer interference filter 6 has favorable color separation properties.

Needless to say, the film thicknesses in the above embodiment and the present variation are merely examples, and the effects of the present invention are unchanged even if other film thicknesses are used.

(3) Although the case in which two spacer layers are provided regardless of the color of light to be transmitted is described in the above embodiment, the present invention is of course not limited to this. Instead, the number of spacer layers may be changed according to the color of light to be transmitted. For example, due to the fact that the passband width with respect to blue light is narrower than that of other colors of light if there is only one spacer layer, two spacer layers may be provided in only the blue region to expand the passband width.

(4) Although the case in which the multilayer interference filter is composed of mainly 11 layers is described in the above embodiment, the present invention is of course not limited to this. Instead of 11 layers, a multilayer interference filter composed of 15 layers, 19 layer, 23 layers, or even more layers may be used.

Also, although the case in which the multilayer interference filter includes two spacer layers is described in the above embodiment, the present invention is not limited to this. Three or more spacer layers may be included instead.

(5) Although the case in which monosilicon dioxide is used as the spacer layer material is described in the above embodiment, the present invention is of course not limited to this. Another material may be used instead. Also, the spacer layer material may be the same as either the high refractive index layer or the low refractive index layer which constitute the $\lambda/4$ multilayer films, or different from either of these. Also, different materials may be used for each of the two spacer layers, as mentioned above.

(6) Although not mentioned in the above embodiment, the pixels of each color may be disposed in a Bayer pattern. In this case, two of the four pixels that make up a rectangular region may be set as the color whose spectral properties have the narrowest passband width. This enables an insufficient amount of light resulting from a narrow passband width to be compensated for by increasing the number of corresponding pixels.

Although the present invention has been fully described by way of examples with reference to the accompanying drawings, it is to be noted that various changes and modifications will be apparent to those skilled in the art. Therefore, unless such changes and modifications depart from the scope of the present invention, they should be construed as being included therein.

What is claimed is:

1. A solid-state imaging device including a multilayer interference filter that transmits incident light of a predetermined wavelength,
the multilayer interference filter comprising:
   N $\lambda/4$ multilayer films, each N $\lambda/4$ multilayer film being constituted from two types of dielectric layers that are alternately laminated, have a same optical thickness substantially equal to ¼ of a predetermined central wavelength setting $\lambda$, and have a different refractive index; and
   M insulation layers, being alternately laminated with the N $\lambda/4$ multilayer films, and each of the M insulation layers having an optical thickness different from the optical thickness of each of the dielectric layers that constitute the N $\lambda/4$ multilayer films, wherein
   N is a value greater than or equal to 3, and
   M is a value greater than 1 and less than N.

2. The solid-state imaging device of claim 1, wherein N has a lowest value among possible values of N.

3. The solid-state imaging device of claim 1, further including a plurality of two-dimensionally arranged pixels, each of the plurality of pixels detecting one of three primary colors, wherein
   the multilayer interference filter is included in, from among the plurality of pixels, a pixel that detects blue light.

4. The solid-state imaging device of claim 1, further including a plurality of two-dimensionally arranged pixels, wherein
   the multilayer interference filter is included in each of the pixels,
   in each of the pixels, the multilayer interference filter included therein selectively transmits a color of light to be detected by the pixel, and
   a film thickness of the multilayer interference filter is substantially the same regardless of the color of light to be transmitted.

5. The solid-state imaging device of claim 1, wherein
   the M insulation layers are composed of a material used in the N $\lambda/4$ multilayer films.

6. A camera including a solid-state imaging device that includes a multilayer interference filter which transmits incident light of a predetermined wavelength,
   the multilayer interference filter comprising:
      N $\lambda/4$ multilayer films, each N $\lambda/4$ multilayer film being constituted from two types of dielectric layers that are alternately laminated, have a same optical thickness substantially equal to ¼ of a predetermined central wavelength setting $\lambda$, and have a different refractive index; and
      M insulation layers, being alternately laminated with the N $\lambda/4$ multilayer films, and each of the M insulation layers having an optical thickness different from the optical thickness of each of the dielectric layers that constitute the N $\lambda/4$ multilayer films, wherein
   N is a value greater than or equal to 3, and
   M is a value greater than 1 and less than N.

* * * * *

UNITED STATES PATENT AND TRADEMARK OFFICE
CERTIFICATE OF CORRECTION

PATENT NO. : 7,623,166 B2  Page 1 of 1
APPLICATION NO. : 11/452952
DATED : November 24, 2009
INVENTOR(S) : Inaba et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 719 days.

Signed and Sealed this

Twenty-sixth Day of October, 2010

David J. Kappos
*Director of the United States Patent and Trademark Office*